(12) United States Patent
Yuasa (10) Patent No.: US 12,112,917 B2
(45) Date of Patent: Oct. 8, 2024

(54) SAMPLE HOLDER AND CHARGED PARTICLE BEAM SYSTEM

(71) Applicant: JEOL Ltd., Tokyo (JP)

(72) Inventor: Shuichi Yuasa, Tokyo (JP)

(73) Assignee: JEOL Ltd., Tokyo (JP)

( * ) Notice: Subject to any disclaimer, the term of this patent is extended or adjusted under 35 U.S.C. 154(b) by 343 days.

(21) Appl. No.: 17/570,802

(22) Filed: Jan. 7, 2022

(65) Prior Publication Data

US 2022/0223370 A1    Jul. 14, 2022

(30) Foreign Application Priority Data

Jan. 8, 2021   (JP) ................................. 2021-002165

(51) Int. Cl.
*H01J 37/20* (2006.01)

(52) U.S. Cl.
CPC ..... *H01J 37/20* (2013.01); *H01J 2237/20207* (2013.01)

(58) Field of Classification Search
CPC ............ H01J 37/20; H01J 2237/20207; H01J 2237/184; H01J 2237/2007; H01J 2237/204

See application file for complete search history.

(56) References Cited

U.S. PATENT DOCUMENTS

| | | | | |
|---|---|---|---|---|
| 3,488,493 A | * | 1/1970 | Mills ....................... | H01J 37/20 250/442.11 |
| 4,587,431 A | * | 5/1986 | Uemura ................... | G21K 5/08 250/442.11 |
| 4,705,950 A | * | 11/1987 | Ohtaka ................... | H01J 37/20 414/217 |
| 4,710,633 A | * | 12/1987 | Suzuki ..................... | H01J 37/20 250/442.11 |
| 6,818,560 B1 | | 11/2004 | Koshimizu et al. | |
| 2006/0022135 A1 | | 2/2006 | Moore et al. | |
| 2015/0076344 A1 | * | 3/2015 | Heyoung ................ | H01J 37/20 250/311 |

(Continued)

FOREIGN PATENT DOCUMENTS

CN    203062587 U    7/2013
EP      3038131 A1    6/2016

(Continued)

OTHER PUBLICATIONS

Notice of Allowance And Fee(s) Due issued in U.S. Appl. No. 17/570,749 on Feb. 2, 2023.

(Continued)

*Primary Examiner* — David E Smith
*Assistant Examiner* — Christopher J Gassen
(74) *Attorney, Agent, or Firm* — The Webb Law Firm (57) ABSTRACT

There is provided a sample holder which is for use in a charged particle beam system and which can prevent damage to a sample stage during transportation of a cartridge. The sample holder includes: the cartridge having the sample stage for holding a sample therein; and a holder base having a mounting portion to which the cartridge can be mounted. The cartridge has: a tilt mechanism for tilting the sample stage; and a lock lever which, when the cartridge has been taken out from the mounting portion, makes contact with the sample stage and limits tilt of the stage.

6 Claims, 4 Drawing Sheets

(56) References Cited

U.S. PATENT DOCUMENTS

| | | |
|---|---|---|
| 2015/0137000 A1 | 5/2015 | Naruse |
| 2017/0133197 A1 | 5/2017 | Kawai |
| 2022/0013325 A1* | 1/2022 | Chen ........................ H01J 37/20 |

FOREIGN PATENT DOCUMENTS

| | | | | |
|---|---|---|---|---|
| JP | H0817381 A | | 1/1996 | |
| JP | H11185686 A | | 7/1999 | |
| JP | 2000268758 A | * | 9/2000 | .............. H01J 37/20 |
| JP | 2002365182 A | | 12/2002 | |
| JP | 201588237 A | | 5/2015 | |
| KR | 1020010039900 A | | 5/2001 | |

OTHER PUBLICATIONS

Extended European Search Report issued in EP21217690.3 on May 30, 2022.
Office Action issued in JP2021002167 on Dec. 20, 2022.
Office Action issued in JP2021002165 on Dec. 20, 2022.
Non-final Office Action issued in U.S. Appl. No. 17/570,775 on Jul. 2, 2024.

* cited by examiner

SAMPLE HOLDER AND CHARGED PARTICLE BEAM SYSTEM

CROSS-REFERENCE TO RELATED APPLICATION

This application claims priority to Japanese Patent Application No. 2021-002165, filed Jan. 8, 2021, the disclosure of which is hereby incorporated by reference in its entirety.

BACKGROUND OF THE INVENTION

1. Field of the Invention

The present invention relates to a sample holder and a charged particle beam system.

2. Description of the Related Art

In the field of charged particle beam systems including transmission electron microscopes, it is known to use an automated transport device for automatically conveying a cartridge, which holds a sample therein, into a sample chamber.

For example, JP-A-2015-88237 discloses a charged particle beam system equipped with a transport rod for carrying a cartridge between a sample exchange chamber and a sample chamber. The sample chamber is a space between the top and bottom polepieces constituting an objective lens. The transport rod carries the cartridge into the sample chamber through the gap between the top and bottom polepieces.

Where a crystalline sample such as a semiconductor material is observed, it is customary to align the crystallographic orientation to the direction of an incident electron beam. Therefore, the cartridge for observation of the crystalline sample has a tilt mechanism for tilting a sample stage.

When the cartridge is conveyed into the sample chamber while the sample stage of the cartridge is tilted, there is the danger that the sample stage will collide against any other member of the charged particle beam system, thus damaging the stage. The gap between the top and bottom polepieces is as narrow as on the order of millimeters, for example. Therefore, if the tilt angle of the sample stage of the cartridge is large, the sample stage will touch the polepieces when the cartridge is passed through the gap between the top and bottom polepieces.

SUMMARY OF THE INVENTION

One aspect of the sample holder associated with the present invention is for use in a charged particle beam system and comprises: a cartridge having a sample stage for holding a sample therein; and a holder base having a mounting portion to which the cartridge can be mounted. The cartridge has: a tilt mechanism for tilting the sample stage; and a lock lever which, when the cartridge has been detached from the mounting portion, makes contact with the sample stage and limits tilt of the sample stage.

With this sample holder, when the cartridge is transported, it is possible to limit tilt of the sample stage and so collision of the sample stage with any other member of the charged particle beam system can be prevented.

One aspect of the charged particle beam system associated with the present invention includes the sample holder described just above.

DESCRIPTION OF THE INVENTION

The preferred embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

1. Sample Holder

Figure 1:
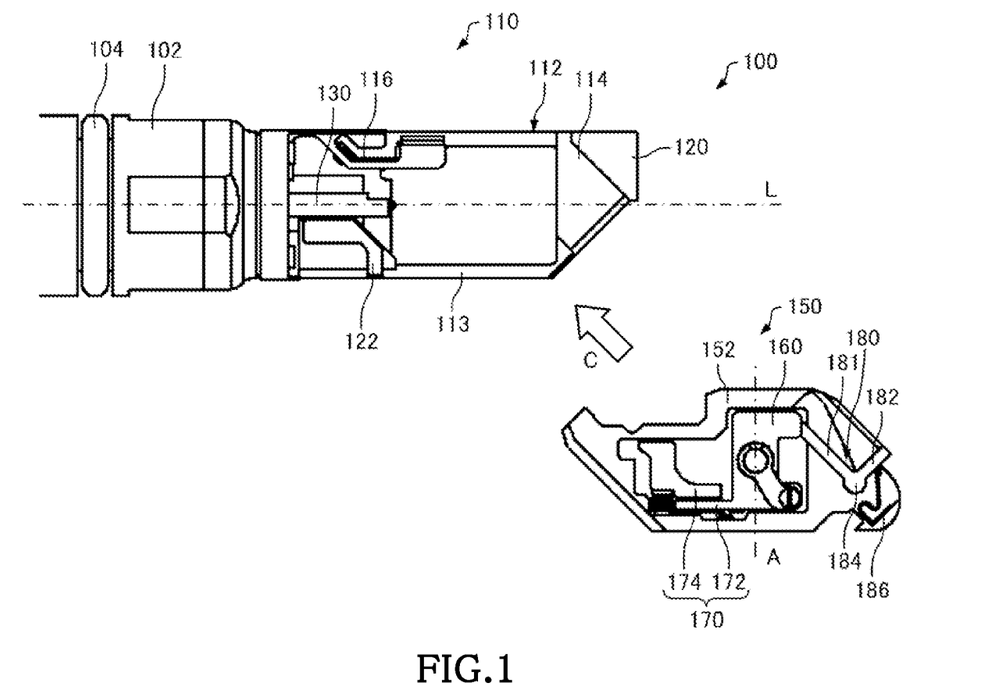
FIGS. 1 and 2 are schematic plan views of a sample holder associated with one embodiment of the present invention, showing different states.
Figure 2:
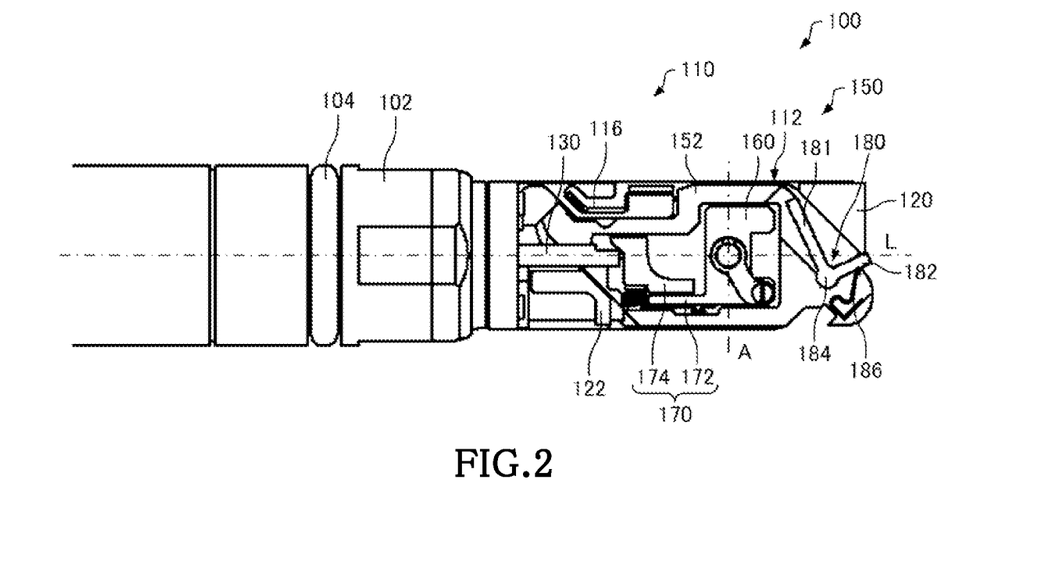

A sample holder associated with one embodiment of the present invention is first described by referring to FIGS. 1 and 2, which are schematic plan views of the sample holder, 100. The sample holder 100 is for use in a transmission electron microscope and includes a holder base 110 and a cartridge 150, as shown. The holder base 110 has a shaft portion 102, a mounting portion 112, a block 120, and another block 122. FIG. 1 shows a state in which the cartridge 150 has been detached from the mounting portion 112 of the holder base 110. FIG. 2 shows a state in which the cartridge 150 has been mounted to the mounting portion 112 of the holder base 110.

The shaft portion 102 is a rodlike member and constitutes a hand grip of the sample holder 100. An O-ring 104 is mounted on the shaft portion 102. In particular, the shaft portion 102 has an outer surface provided with a groove in which the O-ring 104 is mounted. When the sample holder 100 is inserted into an electron microscope, the sample chamber can be made airtight by the O-ring 104. The shaft portion 102 has a grip portion (not shown) at its rear end to permit a user to grip the sample holder 100.

The mounting portion 112 is formed at the front end of the shaft portion 102 and designed such that the cartridge 150 can be mounted thereto. The mounting portion 112 has a cartridge placement surface 114 on which the cartridge 150 is to be placed. Furthermore, the mounting portion 112 has a leaf spring 116 that presses the cartridge 150, which is placed on the placement surface 114, against the blocks 120 and 122 by means of the leaf spring 116, thus securing the cartridge 150.

The blocks 120 and 122 are members which make contact with the cartridge 150 when the cartridge 150 is placed on the cartridge placement surface 114. When the cartridge 150 is mounted to the mounting portion 112, the blocks 120 and 122 operate to guide the cartridge 150.

The holder base 110 has a shaft 130 permitting operation of a tilt mechanism 170 for the cartridge 150. The shaft 130 is coupled to a drive source such as an electric motor via a feed screw (not shown) mounted inside the shaft portion 102.

As shown in FIG. 1, the cartridge 150 is mounted to the mounting portion 112 from a direction C at an angle to the center axis L of the shaft portion 102. In particular, the cartridge 150 is inserted into the mounting portion 112 by moving the cartridge 150 in the oblique direction C while the mounting portion 112 is at rest. Thus, the cartridge 150 is attached to the mounting portion 112.

No restriction is imposed on the method of mounting the cartridge 150 to the mounting portion 112. That is, the configuration of the mounting portion 112 is not restricted to the foregoing example. Rather, the mounting portion 112 may be so configured that the cartridge 150 can be detachably mounted thereto.

The cartridge 150 operates to hold a sample, and has a frame 152, a sample stage 160, the aforementioned tilt mechanism 170, and a lock lever 180. The sample stage 160 holds the sample therein. The sample stage 160 is provided with a through hole over which the sample is secured. The sample is secured on the sample stage 160 using a C-ring or a leaf spring, for example.

The sample stage 160 is coupled to the frame 152 of the cartridge 150 by a shaft member (not shown), the frame 152 being a framelike member. The sample stage 160 is supported by the shaft member so as to be rotatable about an axis A. Therefore, the sample stage 160 can tilt or rotate about the axis A that is a tilted axis. When the cartridge 150 is mounted to the mounting portion 112, the axis A is orthogonal to the center axis L of the shaft portion 102 of the holder base 110.

The tilt mechanism 170 has a tilt arm 172 and a tilt lever 174. The tilt arm 172 is connected to the sample stage 160 and also to the tilt lever 174. When the cartridge 150 has been mounted to the mounting portion 112, the front end of the shaft 130 is in contact with the tilt lever 174. As the shaft 130 stretches and compresses, the tilt lever 174 rotates, and the sample stage 160 connected to the tilt arm 172 tilts around the axis A (see FIG. 5).

After the cartridge 150 has been detached from the mounting portion 112, the lock lever 180 limits tilt of the sample stage 160. The lock lever 180 is in the form of the letter "L", for example, and has a first rodlike member 181 and a second rodlike member 182 which extend mutually perpendicular directions from a shaft member 184. The lock lever 180 can rotate about its axis of rotation, i.e., the shaft member 184.

A resilient member 186 is in contact with the second rodlike member 182. One end of the resilient member 186 is in contact with the second rodlike member 182, while the other end is secured to the frame 152. The resilient member 186 is a leaf spring, for example. In the example shown in FIGS. 1 and 2, the resilient member 186 biases the lock lever 180 to rotate it in a counterclockwise direction.

When the cartridge 150 has been detached from the mounting portion 112 as shown in FIG. 1, the lock lever 180 touches the sample stage 160 and limits its tilt. When the cartridge 150 has been mounted to the mounting portion 112, the lock lever 18 is away from the sample stage 160 as shown in FIG. 2, thus permitting tilting of the sample stage 160.

2. Operation 2.1. Mounting of Cartridge
2.1.1. Operation of Lock Lever

Figure 3:
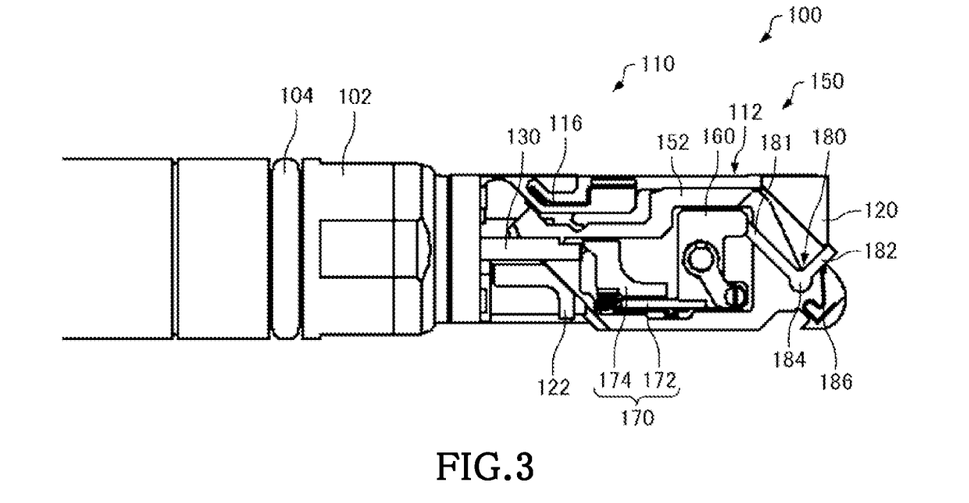
FIG. 3 is a diagram illustrating the operation of a lock lever.

The operation of the lock lever 180 when the cartridge 150 is mounted to the mounting portion 112 of the holder base 110 is first described by referring to FIG. 3, which illustrates the operation of the lock lever 180.

When the cartridge 150 has been detached from the mounting portion 112 as shown in FIG. 1, the lock lever 180 is in contact with the sample stage 160 and limits tilt of the sample stage 160. Specifically, the second rodlike member 182 is biased by the resilient member 186, and the first rodlike member 181 makes contact with the sample stage 160. In the example of FIG. 1, the first rodlike member 181 is located under the sample stage 160. Consequently, the sample stage 160 is limited from tilting and is held horizontally.

The cartridge 150 is made to plunge into the mounting portion 112 while the sample stage 160 is retained horizontally by the lock lever 180. In particular, the cartridge 150 is moved in the direction C at an angle to the center axis L of the shaft portion 102. The cartridge 150 slides on the cartridge placement surface 114 of the mounting portion 112 in the oblique direction C.

Because the sample stage 160 is retained horizontally at this time, if the cartridge 150 is made to plunge into the mounting portion 112, the stage 160 collides neither against the frame 113 of the mounting portion 112 nor against the cartridge placement surface 114.

As shown in FIG. 3, the cartridge 150 passes between the blocks 120 and 122 and moves in the oblique direction C while guided by these blocks 120, 122.

If the cartridge 150 is moved in the oblique direction C, the second rodlike member 182 comes into contact with the block 120. If the cartridge 150 is moved in the oblique direction C further, the lock lever 180 rotates in the clockwise direction about the shaft member 184 because the second rodlike member 182 is in contact with the block 120. This moves the first rodlike member 181 away from the sample stage 160. As a result, tilt of the sample stage 160 is no longer limited, whereby the sample stage 160 is made tiltable.

If the cartridge 150 is moved in the oblique direction C still further, the cartridge 150 is secured to the mounting portion 112 as shown in FIG. 2. Under this condition, the first rodlike member 181 is away from the sample stage 160 and thus the stage 160 is tiltable. The limitation on the tilt of the sample stage 160 by the lock lever 180 is relieved by moving the cartridge 150 in the oblique direction C in this way. The cartridge 150 can be mounted to the mounting portion 112. Because of the process steps described so far, the cartridge 150 can be mounted to the mounting portion 112.

2.1.2. Operation of Tilt Mechanism

Figure 4:
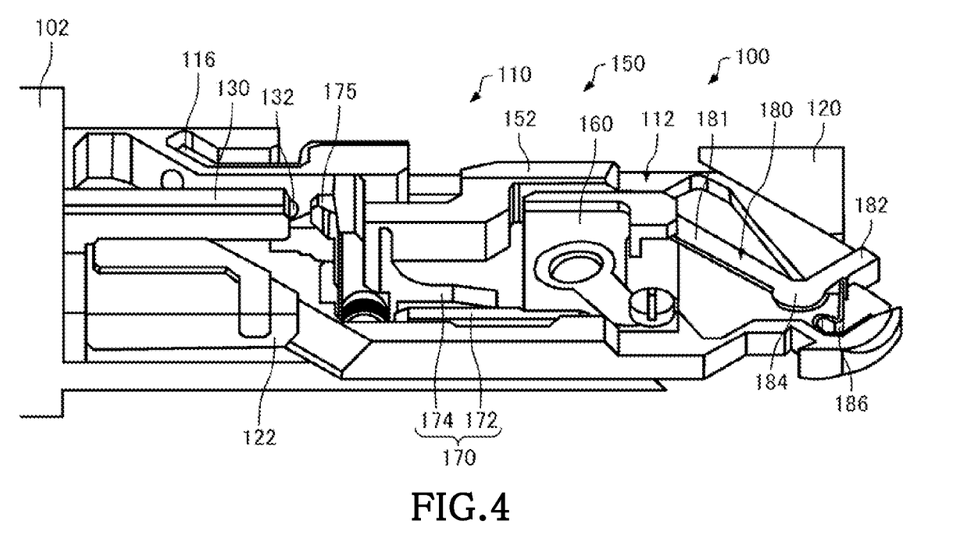
FIGS. 4 and 5 are diagrams illustrating different operational states of a tilt mechanism.
Figure 5:
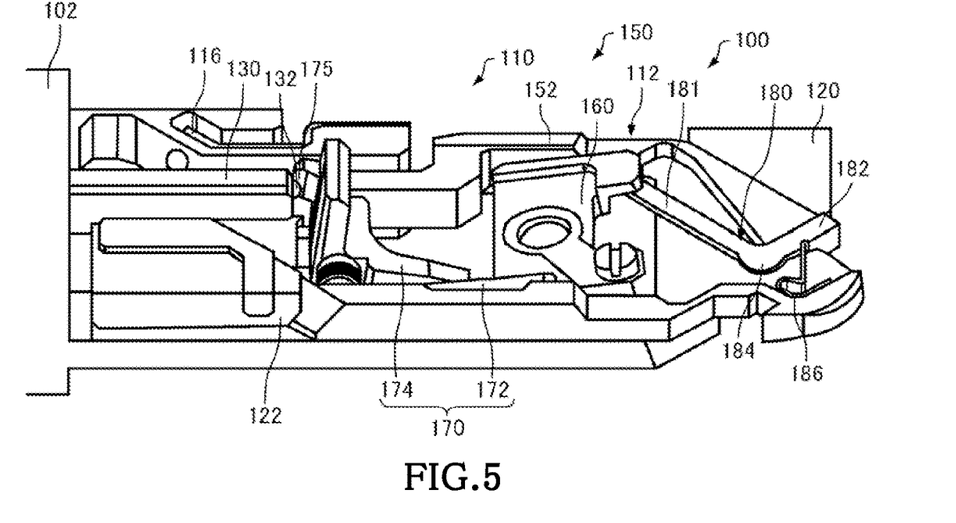

The operation of the tilt mechanism 170 when the cartridge 150 is mounted to the mounting portion 112 is next described by referring to FIGS. 4 and 5, which illustrate the operation of the tilt mechanism 170. Before the second rodlike member 182 strikes the block 120, the first rodlike member 181 is in contact with the sample stage 160 which in turn is maintained horizontally as shown in FIG. 4. At this time, the shaft 130 is not in contact with the tilt lever 174.

FIG. 5 shows a state in which the cartridge 150 has been moved further in the oblique direction C from the state of FIG. 4. As shown in FIG. 5, simultaneously with contact of the second rodlike member 182 with the block 120, the tilt lever 174 touches the shaft 130. In consequence, the shaft 130 pushes the tilt lever 174, so that the lever 174 rotates and tilts the sample stage 160. In the example of FIG. 5, the tilt lever 174 has a protrusion 175 which is in contact with a ball 132 at the front end of the shaft 130.

Because the tilt lever 174 touches the shaft 130 and tilts the sample stage 160 in this way, when the lock lever 180 is rotated and the sample stage 160 is made tiltable, the lock lever 180 (first rodlike member 181) does not come in contact with the sample stage 160. That is, when the lock lever 180 is moved to relieve the limitation on tilt of the sample stage 160, the lock lever 180 does not touch the sample stage 160. Consequently, biting frictional engagement between the lock lever 180 and the sample stage 160 can be prevented.

2.2. Detachment of Cartridge 2.2.1. Operation of Lock Lever

When the cartridge 150 is detached from the mounting portion 112, the lock lever 180 is caused to perform an operation reverse to the operation performed when the cartridge 150 is mounted to the mounting portion 112. In particular, the cartridge 150 is moved in a direction opposite to the oblique direction C from the state of FIG. 2 in which the cartridge 150 is mounted to the mounting portion 112. This moves the second rodlike member 182 away from the block 120. Therefore, the lock lever 180 is biased by the resilient member 186 to rotate in the counterclockwise direction, resulting in contact of the first rodlike member 181 with the sample stage 160 as shown in FIG. 2. As a result, tilt of the sample stage 160 is limited, and the sample stage 160 is held horizontally.

If the cartridge 150 is moved further in the direction opposite to the oblique direction C, the cartridge 150 is detached from the mounting portion 112 while the sample stage 160 is retained horizontally as shown in FIG. 1.

2.2.2. Operation of Tilt Mechanism

When the cartridge 150 is detached from the mounting portion 112, the tilt mechanism 170 performs an operation reverse to that done when the cartridge 150 is mounted to the mounting portion 112. Specifically, in the state of FIG. 5 where the cartridge 150 is mounted to the mounting portion 112, the cartridge 150 is moved in the direction opposite to the oblique direction C. Consequently, the lock lever 180 rotates in the counterclockwise direction. At this time, the tilt lever 174 is in contact with the shaft 130, and the sample stage 160 is tilted. Therefore, the lock lever 180 can move to below the sample stage 160 without touching the sample stage 160.

If the cartridge 150 is moved in the direction opposite to the oblique direction C, the shaft 130 and the tilt lever 174 move away from each other as shown in FIG. 4, thus making the sample stage 160 horizontal. As a result, the sample stage 160 makes contact with the lock lever 180 (first rodlike member 181), limiting tilt of the sample stage 160.

3. Functions and Effects

The sample holder 100 includes: the cartridge 150 having the sample stage 160 for holding a sample therein; and the holder base 110 having the mounting portion 112 to which the cartridge 150 can be mounted. The cartridge 150 has: the tilt mechanism 170 for tilting the sample stage 160; and the lock lever 180 which, when the cartridge 150 has been detached from the mounting portion 112, makes contact with the sample stage 160 and limits tilt of the sample stage 160.

Therefore, when the cartridge 150 is transported, the sample holder 100 can limit tilt of the sample stage 160. Otherwise, the sample stage 160 may tilt and collide with other members of the electron microscope such as the polepieces and the frame 152 of the mounting portion 112. Hence, damage to the sample stage 160 can be prevented.

The sample holder 100 includes the resilient member 186 connected to the lock lever 180. When the cartridge 150 has been detached from the mounting portion 112, the lock lever 180 is biased into contact with the sample stage 160 by the resilient member 186. When the cartridge 150 has been mounted to the mounting portion 112, the lock lever 180 strikes on the block 120 of the mounting portion 112 and separates from the sample stage 160. Therefore, when the cartridge 150 has been detached from the mounting portion 112, the sample holder 100 touches the sample stage 160 and can limit its tilt. When the cartridge 150 has been mounted to the mounting portion 112, the sample holder 100 moves away from the sample stage 160 and permits tilting of the sample stage 160.

In the sample holder 100, the tilt mechanism 170 has the tilt arm 172 and the tilt lever 174 which are connected to the sample stage 160 and the tilt arm 172, respectively. The holder base 110 has the shaft 130 that comes into contact with the tilt lever 174 when the cartridge 150 has been mounted to the mounting portion 112. The tilt lever 174 comes into contact with the shaft 130 and causes tilting of the sample stage 160, whereby the sample stage 160 and the lock lever 180 move away from each other.

Therefore, in the sample holder 100, when the lock lever 180 rotates, it does not touch the sample stage 160. This prevents biting frictional engagement between the lock lever 180 and the sample stage 160.

4. Electron Microscope 4.1. Configuration of the Electron Microscope

Figure 6:
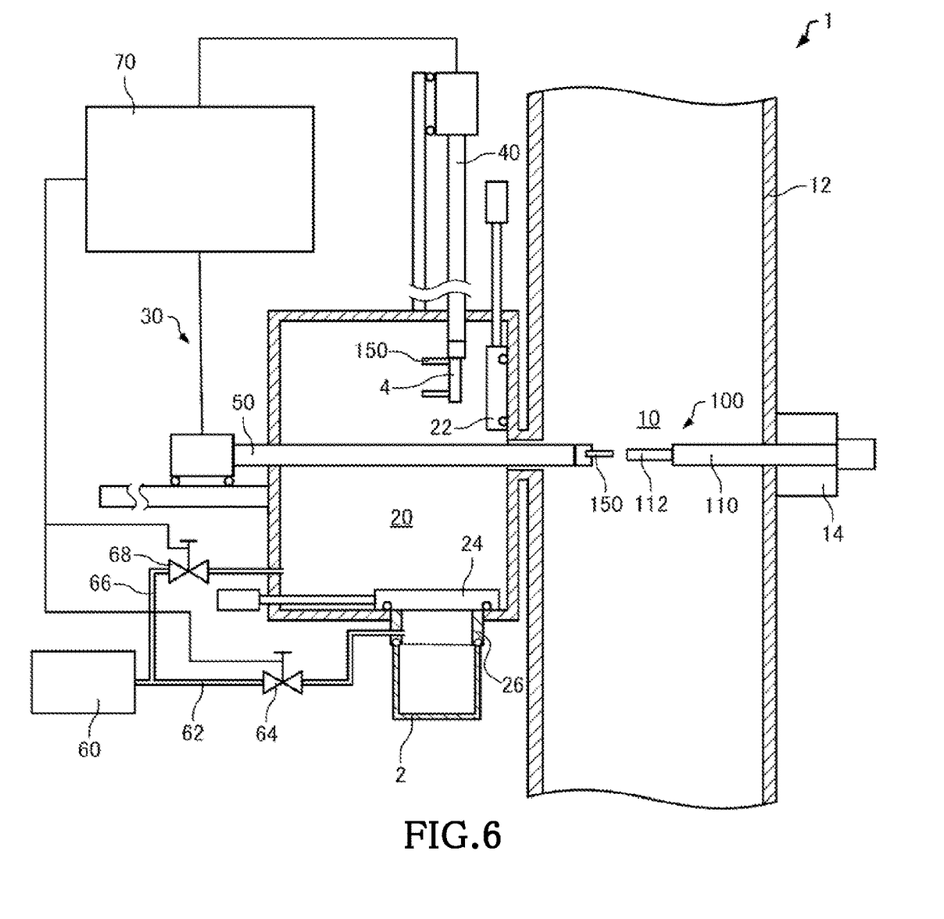
FIGS. 6 and 7 are diagrams illustrating the configuration of an electron microscope including the sample holder of FIGS. 1 and 2.
Figure 7:
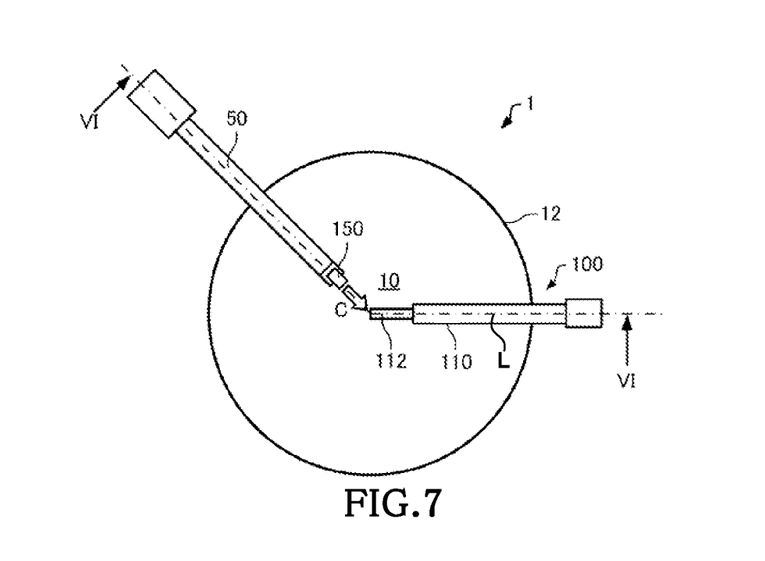

An electron microscope including the sample holder 100 is next described. FIGS. 6 and 7 illustrate the configuration of the electron microscope, generally indicated by reference numeral 1, including the sample holder 100. FIG. 6 is a cross-sectional view taken on line VI-VI of FIG. 7. In FIG. 7, for the sake of convenience, only the sample holder 100, a second transport rod 50, and an electron optical column 12 are shown.

As shown in FIG. 6, the electron microscope 1 includes a sample chamber 10, a sample exchange chamber 20, a transport device 30, vacuum pumping equipment 60, a controller 70, and the sample holder 100. The electron microscope 1 is a transmission electron microscope, for example.

The sample chamber 10 is a space inside the electron optical column 12. An electron source for emitting an electron beam, an illumination optical system, and an imaging system (none of which are shown) are housed in the electron optical column 12. The electron beam emitted from the electron source is directed at a sample by the illumination optical system. The imaging system creates a focused TEM image from the electron beam transmitted through the sample. The electron microscope 1 is also equipped with a detector for detecting the image focused by the imaging system and a detector for detecting X-rays released from the sample in a manner not illustrated.

The sample chamber 10 is a space between the top and bottom polepieces of an objective lens (not shown). The sample chamber 10 is evacuated to a vacuum by the vacuum pumping equipment. The mounting portion 112 of the holder base 110 is disposed in the sample chamber 10. The sample held in the sample holder 100 is irradiated with the electron beam within the sample chamber 10.

The sample holder 100 is placed in position by a goniometer stage 14, which can tilt the sample by rotating about the center axis L of the shaft portion 102 of the sample holder 100. Furthermore, the holder can tilt the sample by rotating the sample stage 160 about the axis A. In this way, in the electron microscope 1, the sample can be tilted relative to the two mutually perpendicular axes.

The sample exchange chamber 20 is connected into the sample chamber 10. A partition valve 22 is mounted between the sample exchange chamber 20 and the sample chamber 10.

A sample container 2 can be attached and detached to and from a connective member 26 that is mounted in the sample exchange chamber 20. Another partition valve 24 is mounted between the sample exchange chamber 20 and the sample container 2. A magazine 4 in which a plurality of cartridges 150 are loaded can be received in the sample container 2. The sample exchange chamber 20 and the sample container 2 can be evacuated by the vacuum pumping equipment 60.

The transport device 30 has a first transport rod 40 and the second transport rod 50. The first transport rod 40 transports the cartridges 150 between the sample container 2 and the sample exchange chamber 20. In this example, the first transport rod 40 transports the cartridges 150 by carrying the magazine 4. The first transport rod 40 grips the magazine 4 at its front end and moves the gripped magazine 4 upwardly, thus transporting the magazine 4 from the sample container 2 to the sample exchange chamber 20.

The second transport rod 50 carries each cartridge 150 between the sample exchange chamber 20 and the sample chamber 10. In particular, the second transport rod 50 extracts one cartridge 150 from the magazine 4 gripped by the first transport rod 40. The second transport rod 50 transports the extracted cartridge 150 from the sample exchange chamber 20 into the sample chamber 10 and mounts the cartridge to the mounting portion 112.

As shown in FIG. 7, the second transport rod 50 mounts the cartridge 150 to the mounting portion 112 by moving the cartridge 150 in the oblique direction C relative to the center axis L of the sample holder 100.

The vacuum pumping equipment 60 evacuates the sample container 2 to a vacuum via an exhaust tube 62. A solenoid valve 64 is mounted in the exhaust tube 62. The vacuum pumping equipment 60 also evacuates the sample exchange chamber 20 to a vacuum via an exhaust tube 66. A solenoid valve 68 is mounted in the exhaust tube 66.

The controller 70 controls the partition valves 22, 24, transport device 30, and solenoid valves 64, 68. The controller 70 includes a CPU (central processing unit) and storage devices such as a RAM (random access memory) and a ROM (read only memory). The controller 70 performs various kinds of control operations by executing programs stored in the storage devices with the CPU.

4.2. Operation 4.2.1. Mounting of Cartridge

In the electron microscope 1, the cartridge 150 loaded in the sample container 2 can be automatically transported into the sample chamber 10 and mounted to the mounting portion 112.

The cartridge 150 loaded in the magazine 4 is received in the sample container 2. The sample container 2 containing the cartridge 150 is mounted to the connective member 26. At this time, the partition valve 24 is closed. The user enters an instruction to the controller 70 to introduce the cartridge 150.

Upon receiving the instruction for introducing the cartridge 150, the controller 70 opens the solenoid valve 64 and evacuates the interior of the sample container 2 to a vacuum. When the interior of the sample container 2 becomes below a given pressure, the controller 70 opens the partition valve 24.

The magazine 4 in the sample container 2 is gripped by the first transport rod 40 and transported into the sample exchange chamber 20 under control of the controller 70. Then, the partition valve 24 is closed while the partition valve 22 is opened also under control of the controller 70.

The specified cartridge 150 is gripped by the second transport rod 50 from within the magazine 4 gripped by the first transport rod 40 and is transported into the sample chamber 10 through the gap between the top and bottom polepieces of the objective lens also under control of controller 70.

The cartridge 150 is moved in the oblique direction C by the second transport rod 50 and attached to the mounting portion 112 under control of the controller 70. At this time, the lock lever 180 and the tilt mechanism 170 operate as described in the "2.1. Mounting of Cartridge".

After the cartridge 150 is mounted to the mounting portion 112, the second transport rod 50 is returned into the sample exchange chamber 20 and the partition valve 22 is closed under control of the controller 70.

As a result of the processing steps described thus far, the cartridge 150 can be mounted to the mounting portion 112. Consequently, the sample held in the cartridge 150 can be observed with the electron microscope 1.

4.2.2. Detachment of Cartridge

In the electron microscope 1, the cartridge 150 can be automatically taken out from the mounting portion 112 and carried into the sample exchange chamber 20. The partition valve 22 is opened and the second transport rod 50 is moved into the sample chamber 10 under control of the controller 70. The cartridge 150 mounted to the mounting portion 112 is gripped by the second transport rod 50 and moved in a direction opposite to the oblique direction C also under control of the controller 70. Consequently, the cartridge 150 is removed from the mounting portion 112. At this time, the lock lever 180 and the tilt mechanism 170 operate as described in "2.2. Detachment of Cartridge".

The controller 70 causes the second transport rod 50 to carry the cartridge 150 into the sample exchange chamber 20 through the gap between the top and bottom polepieces of the objective lens. The controller 70 then closes the partition valve 22 after the transportation of the cartridge 150 into the sample exchange chamber 20. Then, the cartridge 150 is loaded by the second transport rod 50 into the magazine 4 gripped by the first transport rod 40 under control of the controller 70. Because of the processing steps described so far, the cartridge 150 can be taken out from the mounting portion 112.

5. Modified Embodiments

In the foregoing embodiment, the charged particle beam system associated with the present invention has been described in which an electron microscope for observing or analyzing a sample using an electron beam is taken as an example. The charged particle beam system associated with the present invention may also be an instrument for making an observation or analysis using a charged particle beam other than an electron beam such as an ion beam. For example, the charged particle beam system associated with the present invention may be a scanning transmission electron microscope, a scanning electron microscope, an Auger electron spectrometer, a focused ion beam system, or the like.

It is to be understood that the present invention is not restricted to the above embodiment and modifications thereof and that the invention can be practiced in further modified forms. For example, the present invention embraces configurations substantially identical (e.g., in function, method and results or in purpose and advantageous effects) to the configurations described in the above embodiment. Furthermore, the present invention embraces configurations similar to the configurations described in the above embodiment except that nonessential portions have been replaced. In addition, the present invention embraces configurations identical in advantageous effects or purpose to the configurations described in the above embodiment. Further, the present invention embraces configurations similar to the configurations described in the above embodiment except that a well-known technique is added.

What is claimed is:

1. A sample holder for use in a charged particle beam system, said sample holder comprising:
    a cartridge having a sample stage for holding a sample therein;
    a holder base having a mounting portion to which the cartridge can be mounted; and
    wherein the cartridge has: a tilt mechanism for tilting the sample stage; and a lock lever which, when the cartridge has been detached from the mounting portion, makes contact with the sample stage and limits tilt of the sample stage;
    a resilient member connected to said lock lever;
    wherein, when said cartridge has been taken out from said mounting portion, the lock lever is biased into contact with said sample stage by the resilient member; and
    wherein, when the cartridge has been mounted to the mounting portion, the lock lever strikes on a block mounted on the mounting portion and moves away from the sample stage.

2. A charged particle beam system comprising a sample holder as set forth in claim 1.

3. The charged particle beam system as set forth in claim 2, further comprising:
    a sample chamber in which said mounting portion of said sample holder is disposed;
    a sample exchange chamber connected into the sample chamber; and
    a transport rod for transporting said cartridge between the sample chamber and the sample exchange chamber.

4. A sample holder for use in a charged particle beam system, said sample holder comprising:
    a cartridge having a sample stage for holding a sample therein; and
    a holder base having a mounting portion to which the cartridge can be mounted;
    wherein the cartridge has: a tilt mechanism for tilting the sample stage; and a lock lever which, when the cartridge has been detached from the mounting portion, makes contact with the sample stage and limits tilt of the sample stage, and
    wherein said tilt mechanism has:
        a tilt arm connected to said sample stage; and
        a tilt lever connected to the tilt arm;
    wherein said holder base has a shaft which, when said cartridge has been mounted to said mounting portion, makes contact with the tilt lever to thereby tilt the sample stage, whereby the sample stage and said lock lever move away from each other.

5. A charged particle beam system comprising a sample holder as set forth in claim 4.

6. The charged particle beam system as set forth in claim 5, further comprising:
    a sample chamber in which said mounting portion of said sample holder is disposed;
    a sample exchange chamber connected into the sample chamber; and
    a transport rod for transporting said cartridge between the sample chamber and the sample exchange chamber.

* * * * *